(12) United States Patent
Itokazu et al.

(10) Patent No.: US 12,336,267 B2
(45) Date of Patent: Jun. 17, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroko Itokazu, Kawasaki (JP); Tomoko Matsudai, Shibuya (JP); Yoko Iwakaji, Meguro (JP); Takako Motai, Yokohama (JP); Keiko Kawamura, Yokohama (JP); Kaori Fuse, Yokohama (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 154 days.

(21) Appl. No.: 17/472,465

(22) Filed: Sep. 10, 2021

(65) Prior Publication Data

US 2022/0085216 A1    Mar. 17, 2022

(30) Foreign Application Priority Data

Sep. 17, 2020 (JP) ................................. 2020-156337

(51) Int. Cl.
*H10D 8/00* (2025.01)
*H10D 12/00* (2025.01)
(Continued)

(52) U.S. Cl.
CPC .......... *H10D 8/422* (2025.01); *H10D 12/481* (2025.01); *H10D 64/117* (2025.01); *H10D 84/617* (2025.01)

(58) Field of Classification Search
CPC .......... H10D 8/00; H10D 8/422; H10D 12/00; H10D 12/481; H10D 12/13; H10D 12/138;
(Continued)

(56) References Cited

U.S. PATENT DOCUMENTS 6,670,650 B2    12/2003  Nemoto et al.
2002/0121678 A1*  9/2002  Huang .................. H01L 29/402
                                                              257/656
(Continued)

FOREIGN PATENT DOCUMENTS

CN        1309093 C      4/2007
CN      103681668 A      3/2014
(Continued)

OTHER PUBLICATIONS

Office Action issued on Nov. 1, 2024, in corresponding Chinese Application No. 202110878861.X, 19 pages.

*Primary Examiner* — Chuong A Luu
(74) *Attorney, Agent, or Firm* — Maier & Maier, PLLC

(57) ABSTRACT

A semiconductor device includes first and second semiconductor layers of a first conductivity type, a third semiconductor layer of a second conductivity type, a plurality of electrodes, and a first insulating film. The second semiconductor layer is provided on the first semiconductor layer. The third semiconductor layer is provided on the second semiconductor layer with a first surface at a side opposite to the first semiconductor layer. The electrodes extend from the first surface into the second semiconductor layer. A first insulating film provided between the second and third semiconductor layers and each of electrodes. The electrodes include first and second electrode groups. The first electrode group is arranged in one column in the first direction and apart from each other by a first distance. The first and second (Continued)

electrode groups are apart from each other by a second distance in the second direction.

10 Claims, 10 Drawing Sheets

(51) Int. Cl.
  *H10D 64/00* (2025.01)
  *H10D 84/60* (2025.01)
(58) Field of Classification Search
  CPC ...... H10D 12/01; H10D 12/17; H10D 12/038;
    H10D 12/393; H10D 62/10; H10D
    62/103; H10D 62/115; H10D 62/128;
    H10D 62/117; H10D 62/126; H10D
    64/00; H10D 64/23; H10D 64/112; H10D
    64/117; H10D 64/27; H10D 64/513;
    H10D 84/60; H10D 84/80; H10D 84/617;
    H10D 84/811; H01L 29/78; H01L 29/739;
    H01L 29/08; H01L 29/861; H01L 29/868;
    H01L 29/423; H01L 29/7813; H01L
    29/0865; H01L 29/0882; H01L 29/4236;
    H01L 21/336
  USPC .......................................................... 257/140
  See application file for complete search history.

(56) References Cited

U.S. PATENT DOCUMENTS

| | | | |
|---|---|---|---|
| 2003/0052383 A1 | 3/2003 | Nemoto et al. | |
| 2004/0084721 A1* | 5/2004 | Kocon | H01L 29/861 |
| | | | 257/E29.256 |
| 2005/0073030 A1 | 4/2005 | Inoue et al. | |
| 2014/0070266 A1 | 3/2014 | Matsudai et al. | |
| 2014/0084335 A1* | 3/2014 | Senoo | H01L 27/0761 |
| | | | 257/140 |
| 2014/0084336 A1 | 3/2014 | Matsudai et al. | |
| 2014/0284711 A1 | 9/2014 | Katoh et al. | |
| 2015/0349103 A1 | 12/2015 | Onozawa et al. | |
| 2016/0071940 A1 | 3/2016 | Okumura | |
| 2016/0260809 A1* | 9/2016 | Hirler | H01L 29/7813 |
| 2018/0350961 A1 | 12/2018 | Naito | |
| 2019/0081163 A1 | 3/2019 | Mizukami | |
| 2021/0202725 A1 | 7/2021 | Akai et al. | |
| 2021/0351284 A1 | 11/2021 | Kubouchi | |

FOREIGN PATENT DOCUMENTS

| | | |
|---|---|---|
| CN | 103681882 A | 3/2014 |
| CN | 103956388 A | 7/2014 |
| CN | 104995738 A | 10/2015 |
| CN | 105448993 A | 3/2016 |
| CN | 105938847 A | 9/2016 |
| CN | 113287201 A | 8/2021 |
| JP | 2003-115596 A | 4/2003 |
| JP | 2004-186413 A | 7/2004 |
| JP | 4100071 B2 | 6/2008 |
| JP | 4639704 B2 | 2/2011 |
| JP | 2014-067763 A | 4/2014 |
| JP | 2014187141 A | 10/2014 |
| JP | 2017208413 A | 11/2017 |
| JP | 2019-130017 A | 8/2019 |
| JP | 2020043237 A | 3/2020 |
| WO | WO2018/030440 A1 | 2/2018 |

* cited by examiner

SEMICONDUCTOR DEVICE

CROSS-REFERENCE TO RELATED APPLICATIONS

This application is based upon and claims the benefit of priority from Japanese Patent Application No. 2020-156337, filed on Sep. 17, 2020; the entire contents of which are incorporated herein by reference.

FIELD

Embodiments relate to a semiconductor device.

BACKGROUND

Semiconductor devices such as IGBTs (Insulated Gate Bipolar Transistors), diodes, and the like are used in power converters, for example, inverters and the like. A so-called FWD (Free Wheeling Diode), for example, is connected in anti-parallel with an IGBT. To increase the conversion efficiency, it is required for such a power converter to improve the characteristics of the FWD.

DETAILED DESCRIPTION

Figure 1A:
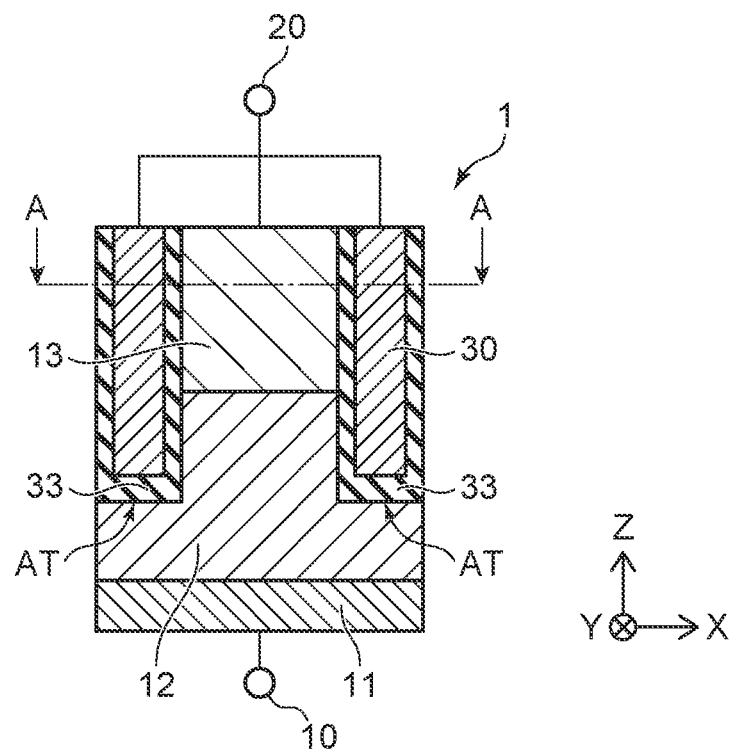
FIGS. 1A and 1B are schematic views showing a semiconductor device according to an embodiment.

According to an embodiment, a semiconductor device includes first and second semiconductor layers of a first conductivity type, a third semiconductor layer of a second conductivity type, a plurality of electrodes, and a first insulating film. The second semiconductor layer is provided on the first semiconductor layer and includes a first-conductivity-type impurity with a lower concentration than a concentration of a first-conductivity-type impurity in the first semiconductor layer. The third semiconductor layer is provided on the second semiconductor layer. The third semiconductor layer includes a first surface at a side opposite to the second semiconductor layer. The first surface extends in a first direction and a second direction crossing the first direction. The electrodes are provided on the second semiconductor layer. The electrodes respectively extend inside trenches each having depths enough to extend from the first surface into the second semiconductor layer. A first insulating film provided between the third semiconductor layer and one of the electrodes and between the second semiconductor layer and the one of the electrodes. The electrodes include first and second electrode groups. The first electrode group is arranged in one column in the first direction and apart from each other by a first distance. The second electrode group is arranged in another column in the first direction and apart from each other by the first distance. The first electrode group and the second electrode group are apart from each other by a second distance in the second direction, the first distance being greater than the second distance.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
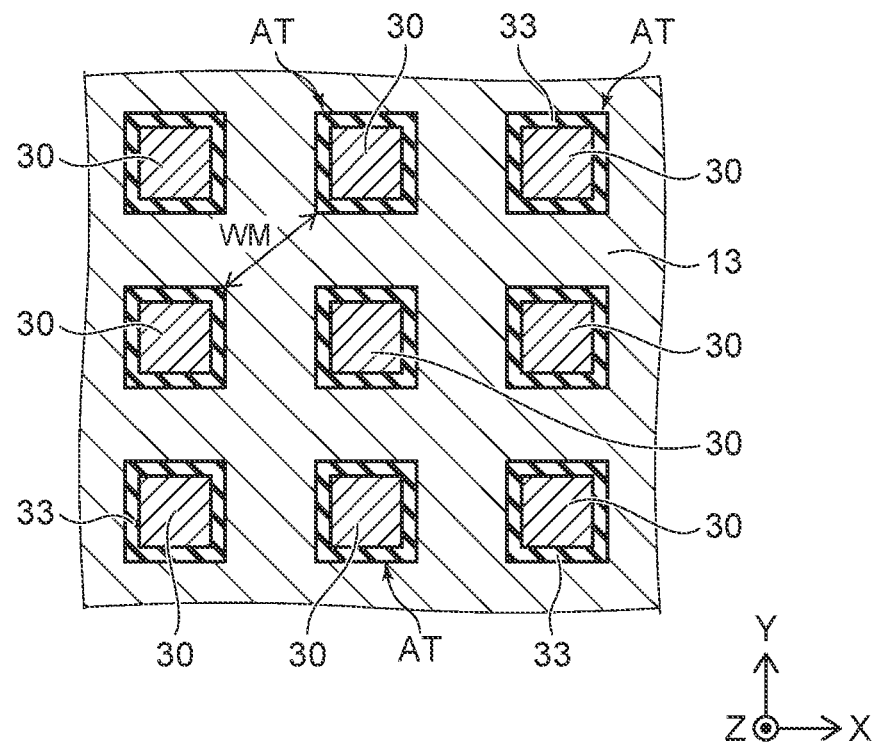

FIGS. 1A and 1B are schematic views showing a semiconductor device 1 according to an embodiment. FIG. 1A is a cross-sectional view along the X-Z plane. FIG. 1B is a plan view illustrating a cross section along line A-A shown in FIG. 1A.

The semiconductor device 1 is, for example, a diode. The semiconductor device 1 is integrated and used with the IGBT. Embodiments described below are examples and are not limited thereto.

As shown in FIG. 1A, the semiconductor device 1 includes a first semiconductor layer 11 of a first conductivity type, a second semiconductor layer 12 of the first conductivity type, and a third semiconductor layer 13 of the second conductivity type. The second semiconductor layer 12 is provided on the first semiconductor layer 11. The third semiconductor layer 13 is provided on the second semiconductor layer 12. The second semiconductor layer 12 includes a first-conductivity-type impurity with a lower concentration than the first-conductivity-type impurity in the first semiconductor layer 11.

The first semiconductor layer 11 is, for example, an n-type cathode layer. The third semiconductor layer 13 is, for example, a p-type anode layer. In the following description, the first conductivity type is described as an n-type; and the second conductivity type is described as a p-type.

The semiconductor device 1 further includes an electrode 30. The electrode 30 is provided inside a trench AT that has a depth enough to extend from the surface of the third semiconductor layer 13 into the second semiconductor layer 12. The electrode 30 extends in the third semiconductor layer 13 and the second semiconductor layer 12. The electrode 30 is, for example, conductive polysilicon. For example, the electrode 30 is electrically insulated from the third and second semiconductor layers 13 and 12 by an insulating film 33. The insulating film 33 is provided between the electrode 30 and the third semiconductor layer 13 and between the electrode 30 and the second semiconductor layer 12. The insulating film 33 is, for example, a silicon oxide film.

The first semiconductor layer 11 is electrically connected to an electrode 10 (a cathode electrode). The third semiconductor layer 13 is electrically connected to an electrode 20 (an anode electrode), For example, the electrode 30 is electrically connected to the electrode 20 and has the same potential as the third semiconductor layer 13. Embodiments are not limited thereto; for example, the electrode 30 may be electrically connected to another electrode that is not illustrated and may be biased to a different potential from the third semiconductor layer 13.

As shown in FIG. 1B, multiple electrodes 30 are provided respectively inside the multiple trenches AT. Some of the multiple electrodes 30 form, for example, a column in which electrodes 30 are arranged in a Y-direction; and multiple columns each including the electrodes 30 are arranged in the X-direction.

The multiple trenches AT, for example, are arranged so that the second semiconductor layer 12 includes a region positioned between neighboring trenches AT, and the region of the second semiconductor layer 12 is depleted when a prescribed reverse bias of, for example, 1 V is applied between the first semiconductor layer 11 and the third semiconductor layer 13. In other words, a maximum width WM between the neighboring trenches AT is provided so that the current path between the neighboring trenches AT is pinched off.

For example, in a cross-section of the second semiconductor layer 12 parallel to X-Y plane, a distance between the neighboring trenches AT is defined as a length of a line segment between neighboring trenches AT when a straight line is drawn in the cross-section through any point in the second semiconductor layer 12. The distance or spacing between the trenches AT, and the length of the trench AT are determined based on the position of the sidewall of the trench AT or the outer edge of the insulating film 33 included in the trench AT as a reference. The maximum distance between the neighboring trenches AT in the second semiconductor layer 12 is the maximum width WM.

Figure 2A:
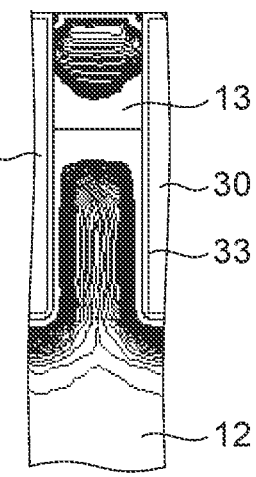
FIGS. 2A to 2C are schematic views showing characteristics of the semiconductor device according to the embodiment.
Figure 2B:
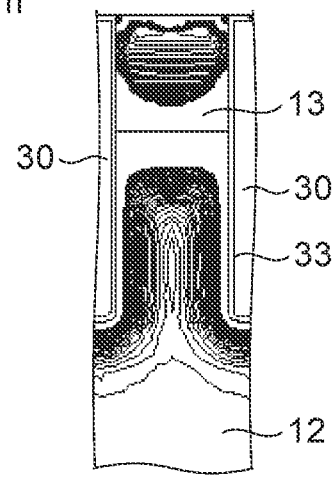
Figure 2C:
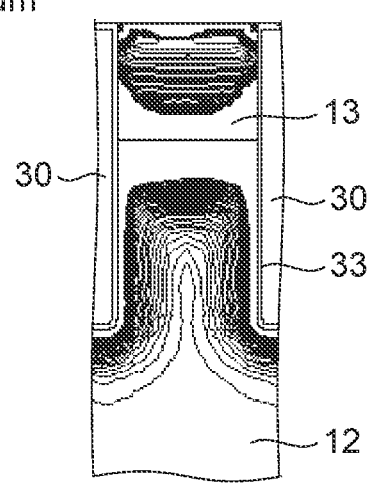
Figure 3:
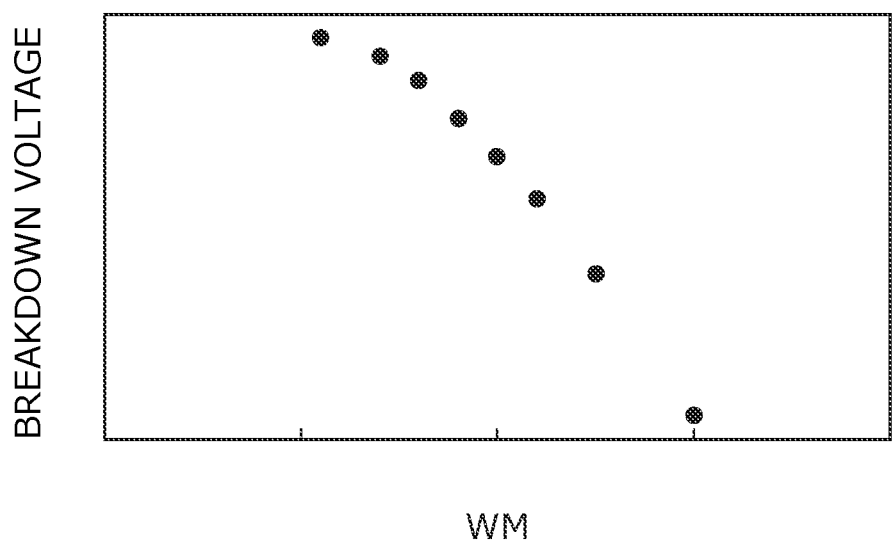
FIG. 3 is a graph showing another characteristic of the semiconductor device according to the embodiment.

FIGS. 2A to 2C and FIG. 3 are schematic views showing characteristics of the semiconductor device 1 according to the embodiment. FIGS. 2A to 2C are schematic views showing the cross-section from the surface to the trench bottom between the adjacent trenches AT. The depth of the trench AT is, for example, 5.5 µm. In FIGS. 2A to 2C, the depletion layers in the third and second semiconductor layers 13 and 12 under a prescribed reverse bias of, for example, 1 V are illustrated. The equipotential surfaces shown in the drawings illustrate the spreading of the depletion layer. FIG. 3 is a graph illustrating the reverse breakdown voltage of the semiconductor device 1.

As shown in FIGS. 2A to 2C, the spacings between the adjacent trenches AT (referring to FIG. 1B) are 1.6 micrometers (hereinbelow, µm), 2.0 µm, and 2.5 µm, respectively.

As shown in FIGS. 2A and 2B, the depleted portion of the second semiconductor layer 12 is provided between the adjacent trenches AT when the spacing between the adjacent trenches AT is 1.6 µm and 2.0 µm. Such a depleted state is so called pinch-off. As shown in FIG. 2C, a portion of the second semiconductor layer 12 is not depleted between the adjacent trenches AT when the spacing between the adjacent trenches AT is 2.5 µm.

In FIG. 3, illustrated is the relationship between the spacing between the adjacent trenches AT and the reverse breakdown voltage (the breakdown voltage). As shown in FIG. 3, the breakdown voltage decreases as WM increases.

According to the embodiment, the semiconductor device 1 includes the electrode 30 that has a trench structure to ensure the reverse breakdown voltage and the anode-cathode breakdown immunity. However, by providing the electrode 30, the surface area in the X-Y plane of the second semiconductor layer 12 is reduced. Compared to the case in which the electrode 30 is not provided, the conduction path of the carriers is narrow, and the carrier density (the density of the electrons and holes) in the third semiconductor layer 13 is high.

For example, in a power conversion device such as an inverter, etc., it is desirable to improve the characteristics such as the on-voltage, the recovery time, the safe operation region in recovery, and the current and voltage oscillation in recovery, etc. Here, the on-voltage is the voltage drop in the conducting state; the recovery time is the extinction time of the recovery current in reverse recovery; and the safe operation region in recovery is an operation region in which breakdown does not occur even when a voltage is applied while a reverse recovery current flows. Among these characteristics, it is important to widen the safe operation region in recovery while shortening the recovery time.

In the semiconductor device 1, by providing a plurality of the trenches AT with a regulated arrangement, in which the electrodes 30 are provided respectively, a uniform avalanche phenomenon can be generated at the bottoms of the trenches AT; and the breakdown immunity may be increased. Moreover, the reverse breakdown voltage may be increased by providing the spacing WM between the adjacent trenches AT that is less than the spacing at which pinch-off occurs even if the low reverse bias, for example, about 1 V is applied.

By forming the trenches AT, however, the carrier density in the second and third semiconductor layers 12 and 13 is increased in the on-state. Therefore, the recovery characteristics degrade while transitioning from the on-state to the off-state, and the recovery loss is large compared to when the trenches AT are not provided.

In the semiconductor device 1, the trench AT is provided with a less occupancy ratio in the X-Y cross section of the third semiconductor layer 13 so that the density of the holes injected from the third semiconductor layer 13 into the second semiconductor layer 12 is reduced. Thereby, the recovery loss may be reduced while suppressing the reduction of the reverse breakdown voltage and the breakdown immunity.

Figure 4A:
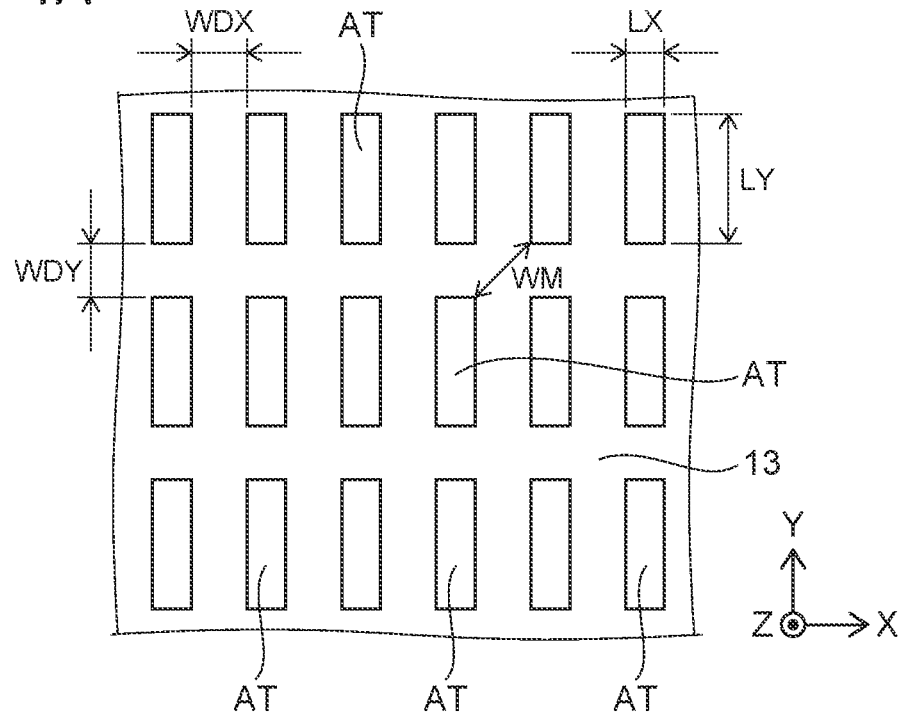
FIGS. 4A and 4B are schematic views showing trench arrangements of the semiconductor device according to the embodiment.
Figure 4B:
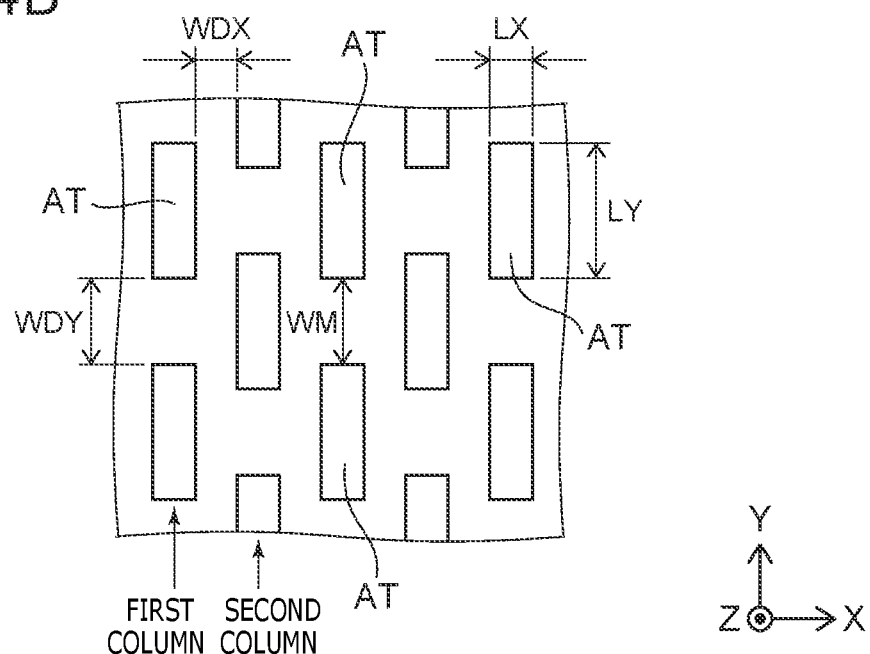

FIGS. 4A and 4B are schematic plan views illustrating configurations of the semiconductor device 1 according to the embodiment. FIGS. 4A and 4B are plan views illustrating arrangements of the trench AT. The electrode 30, the insulating film 33, and the third semiconductor layer 13 are not illustrated in the layout drawings of the trenches AT shown below.

As shown in FIG. 4A, for example, the trench AT has a rectangular X-Y cross section in which sides extend in the X-direction and the Y-direction. The multiple trenches AT are arranged in a matrix configuration by being arranged in the Y-direction to form columns and by being arranged in the X-direction to form rows, A length LY in the Y-direction of the trench AT is greater than a length LX in the X-direction. The adjacent trenches AT in the X-direction are arranged with a spacing WDX. The adjacent trenches AT in the Y-direction are arranged with a spacing WDY. The spacing between the adjacent trenches AT has a maximum, for example, in the diagonal direction of the arrangement of the multiple trenches AT. Here, the diagonal direction is the direction directed from a coordinate (LX, LY) toward another coordinate (LX+WDX, LY+WDY) in the X-Y plane. The maximum spacing WM is, for example, the distance between the end portions of the neighboring trenches AT in the diagonal direction and is not more than 2 µm.

In the example shown in FIG. 4B, first and second columns each include the trenches AT of the multiple trenches AT arranged in the Y-direction. The first column is adjacent to the second column in the X-direction. Each trench AT in the first column and a space between the trenches AT in the second column are arranged in the X-direction. The spacing WDY between the trenches AT that are adjacent in the Y-direction is less than the length LY in the Y-direction of the trench AT. The spacing WDX between the trenches AT that are adjacent in the X-direction is, for example, not more than 1 µm. In such a case, the spacing WM between the adjacent trenches AT has a maximum between the trenches AT that are adjacent in the Y-direction. The spacing WM between the adjacent trenches AT is, for example, not more than 2 µm.

Figure 5A:
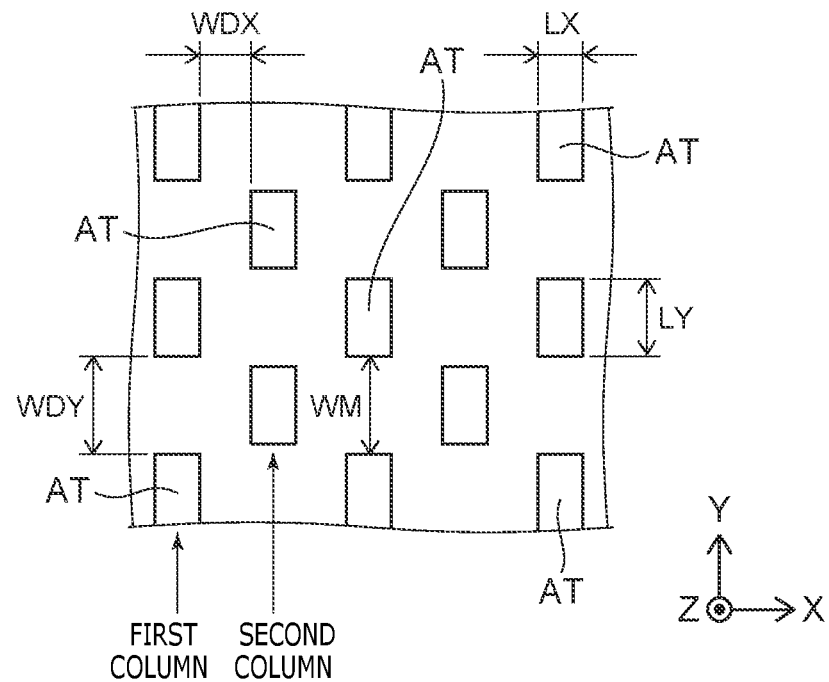
FIGS. 5A and 5B are schematic views showing trench arrangements of semiconductor devices according to modifications of the embodiment.
Figure 5B:
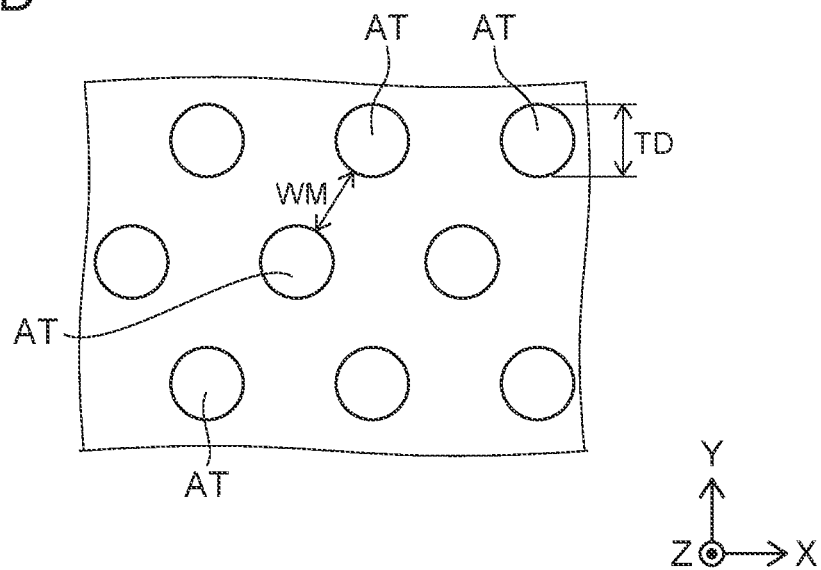

FIGS. 5A and 5B are schematic views illustrating configurations of the semiconductor device 1 according to modifications of the embodiment. FIGS. 5A and 5B are plan views illustrating arrangements of the trenches AT.

As shown in FIG. 5A, the first and second columns each includes the trenches AT of the multiple trenches AT that are arranged in the Y-direction. The second column is adjacent to the first column. Each trench AT in the first column and a space between the trenches AT in the second column are arranged in the X-direction. The spacing WDY between the trenches AT that are adjacent in the Y-direction is greater than the length LY in the Y-direction of each trench AT, WDX is, for example, not more than 1 µm. In such a case as well, the spacing WM between the adjacent trenches AT has a maximum between the trenches AT that are adjacent in the Y-direction. The spacing WM between the adjacent trenches AT is, for example, not more than 2 µm.

As shown in FIG. 5B, for example, the trench AT may have a circular cross section in the X-Y plane. The trenches AT are arranged in, for example, the diagonal direction of the arrangement thereof. The spacing WM is provided between the trenches AT that are adjacent in the diagonal direction, and is, for example, not more than 2 µm.

Figure 6A:
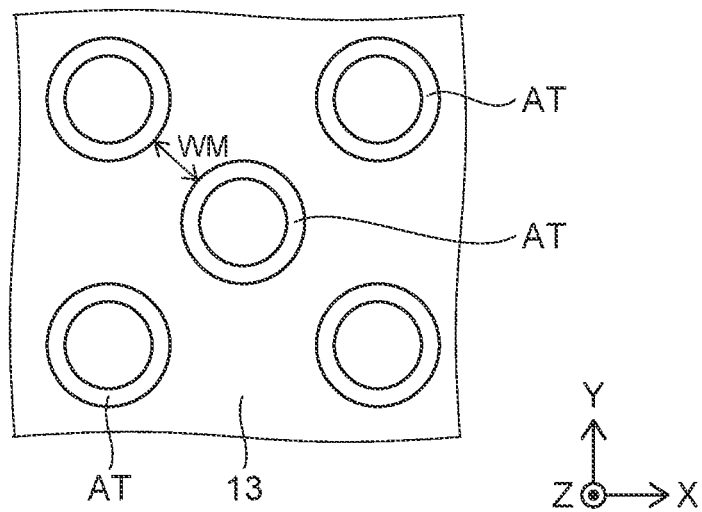
FIGS. 6A and 6B are schematic views showing trench arrangements of semiconductor devices according to other modifications of the embodiment.
Figure 6B:
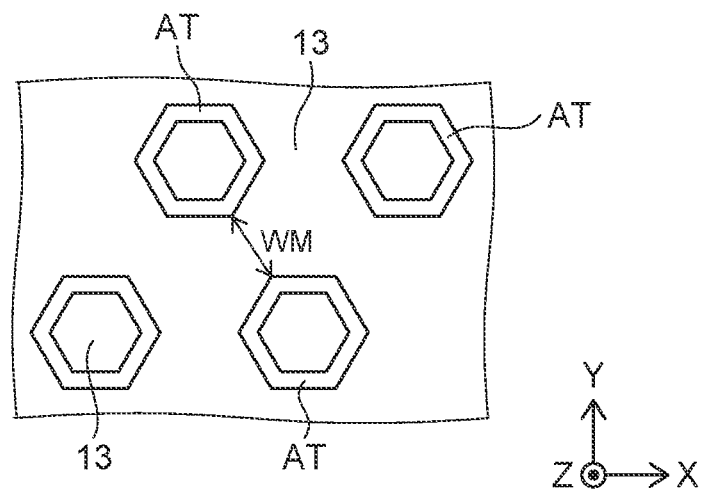

FIGS. 6A and 6B are schematic views showing configurations of the semiconductor device 1 according to other modifications of the embodiment, FIGS. 6A and 6B are plan views illustrating the arrangements of the trenches AT.

As shown in FIG. 6A, the trench AT may have, for example, a circular-ring-shaped cross section in the X-Y plane. The trench AT surrounds a portion of the third semiconductor layer 13 and a portion of the second semiconductor layer 12. The trenches AT are arranged in, for example, the diagonal direction of the arrangement thereof. The spacing WM is provided between the trenches AT that are adjacent in the diagonal direction, and is, for example, not more than 2 µm. The inner diameter of the trench AT is, for example, not more than 2 µm.

As shown in FIG. 6B, the trench AT has, for example, a hexagonal-ring-shaped cross section in the X-Y plane. The trenches AT are arranged in, for example, the diagonal direction of the arrangement thereof. The spacing WM is provided between the trenches AT that are adjacent in the diagonal direction, and is, for example, not more than 2 µm. The trench inner diameter is, for example, not more than 2 µm. The exterior shape of the cross section of the trench AT is not limited to hexagonal and may be another polygon.

In the arrangement of the trenches AT described above, it is preferable for the trench AT to have the total cross-sectional area in the X-Y plane, for example, less than the surface area of the third semiconductor layer 13 in the X-Y plane. That is, the third semiconductor layer has a surface area greater in the cross-section than a sum of a cross-sectional area of the plurality of first insulating films and a cross-sectional area of the plurality of electrodes at a level same as a level of the cross-section. Thereby, the density of the holes injected from the third semiconductor layer 13 into the second semiconductor layer 12 can be reduced, and the carrier density in the second semiconductor layer 12 can be reduced.

Figure 7A:
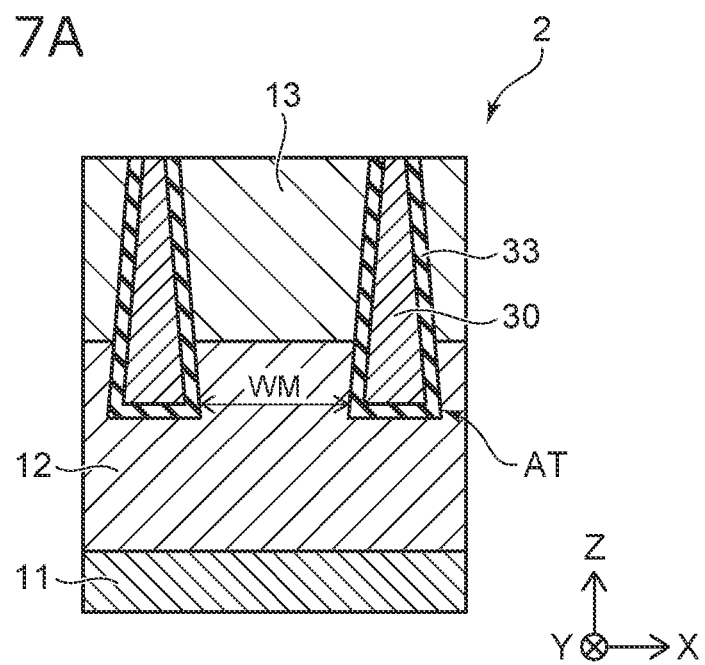
FIGS. 7A and 7B are schematic cross-sectional views showing semiconductor devices according to modifications of the embodiment.
Figure 7B:
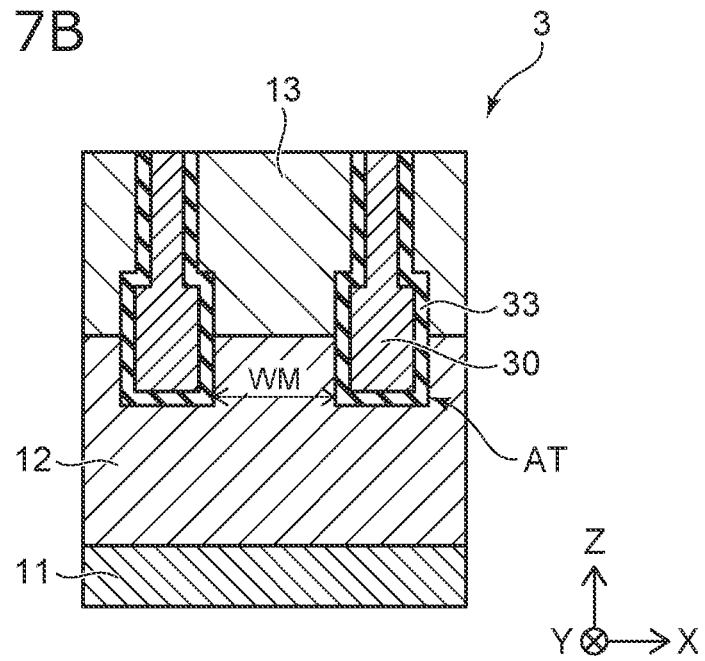

FIGS. 7A and 7B are schematic views showing semiconductor devices 2 and 3 according to modifications of the embodiment.

As shown in FIG. 7A, the semiconductor device 2 includes the trench AT that has a reverse-tapered cross-sectional shape in the X-Z plane. The trench AT of the semiconductor device 2 is provided with the shape such that the bottom of the trench AT positioned in the second semiconductor layer 12 has the width in the X-direction greater than a width in the X-direction at a portion thereof that is positioned in the third semiconductor layer 13. The electrode 30 that is provided inside the trench AT may have a similar cross-sectional shape in the X-Z plane.

In the semiconductor device 2, the spacing WM in the X-direction is ensured between the bottom surfaces of the adjacent trenches AT. The spacing WM is provided so that the pinch-off occurs even if the low reverse bias, for example, 1 V is applied. In contrast, the width in the X-direction of the third semiconductor layer 13 is greater than the spacing WM between the bottom surfaces of the trenches AT.

As shown in FIG. 7B, the semiconductor device 3 includes the trench AT that has the width in the X-direction at the portion positioned in the second semiconductor layer 12 greater than the width in the X-direction at another portion thereof that is positioned in the upper portion of the third semiconductor layer 13. The electrode 30 that is provided inside the trench AT also has a similar cross-sectional shape in the X-Z plane.

In the semiconductor device 3, the spacing WM in the X-direction is ensured between the portions of the adjacent trenches AT positioned in the second semiconductor layer 12. The spacing WM is provided so that the pinch-off occurs under a reverse bias. In contrast, the width in the X-direction of the upper portion of the third semiconductor layer 13 is greater than the spacing WM.

Thus, in the semiconductor devices 2 and 3, the multiple trenches AT are arranged so that the spacing WM between the bottoms of the adjacent trenches AT is less than the pinch-off spacing. The spacing of the upper portion of the third semiconductor layer 13 is greater than WM, and thus, the carrier density can be reduced by increasing the occupancy ratio of the third semiconductor layer 13 in the X-Y plane.

Figure 8:
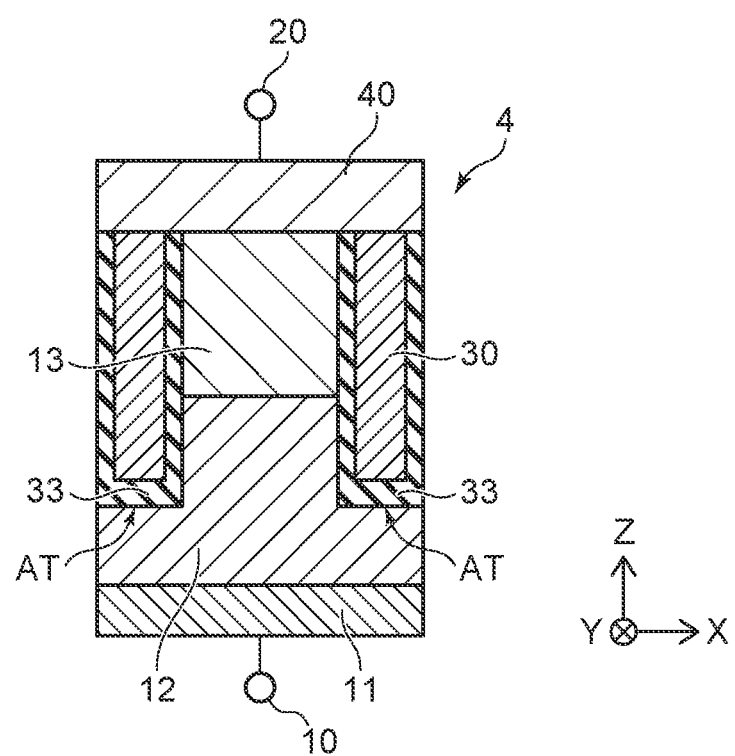
FIG. 8 is a schematic view showing the configuration of an interconnect of a semiconductor device according to another modification of the embodiment.

FIG. 8 is a schematic view showing the configuration of an interconnect 40 of a semiconductor device 4 according to an embodiment.

In the semiconductor device 4, similarly to the semiconductor device 1 shown in FIGS. 1A and 1B, the third semiconductor layer 13 and the electrode 30 are electrically connected by the interconnect 40. The interconnect 40 is, for example, a metal film that is provided on the third semiconductor layer 13, the electrode 30, and the insulating film 33. The interconnect 40 is connected to the anode electrode 20. In any of the semiconductor devices according to embodiments, the interconnect 40 may be provided in the manner shown in FIG. 8.

Figure 9A:
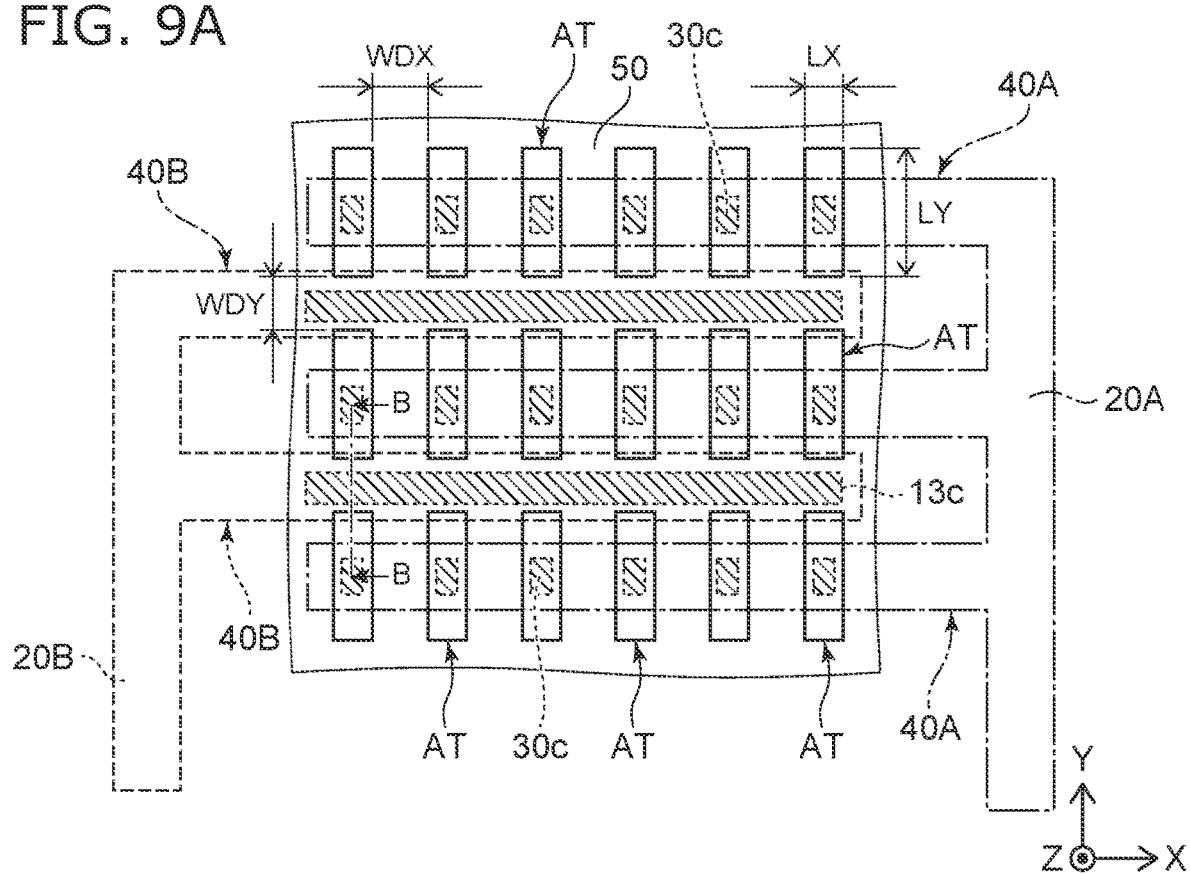
FIGS. 9A and 9B are schematic views showing configurations of interconnects of a semiconductor device according to an embodiment.
Figure 9B:
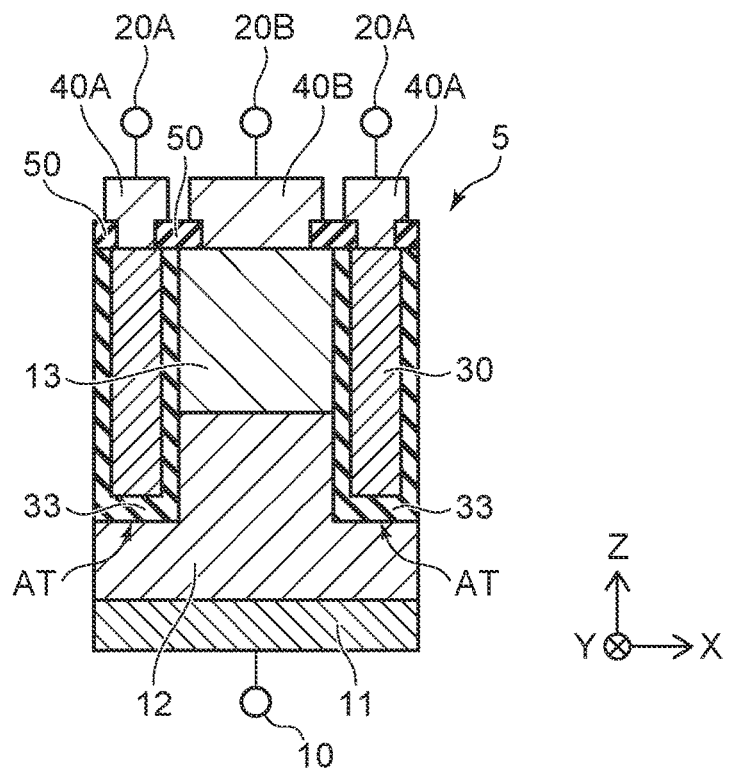

FIGS. 9A and 9B are schematic views showing configurations of interconnects of a semiconductor device 5 according to an embodiment.

According to the embodiment, the semiconductor device 5 may be operate under different potentials applied respectively to the third semiconductor layer 13 and the electrode 30. In addition to the configuration of the semiconductor device 1, the semiconductor device 5 further includes an insulating film 50, an interconnect 40A, and an interconnect 403. FIG. 9A is a schematic plan view illustrating a semiconductor device provided with the interconnects 40A and 403 that are added to the configuration shown in FIG. 4A. FIG. 9B is a cross-sectional view along line B-B shown in FIG. 9A.

The insulating film 50 is provided on the third semiconductor layer 13, the electrode 30, and the insulating film 33. The interconnect 40A (shown by the single dot-dash lines in FIG. 9A) extends in the X-direction on the insulating film 50. The multiple interconnects 40A are connected with an electrode 20A that extends in the Y-direction.

The interconnect 40A is connected to the multiple electrodes 30 via contacts 30c (shown by diagonal-line portions in FIG. 9A) that extend through the insulating film 50. The interconnect 40A is electrically isolated from the third semiconductor layer 13.

The interconnect 40B extends in the X-direction on the insulating film 50, The interconnect 40B (shown by the broken lines in FIG. 9A) is connected to the third semiconductor layer 13 via a contact 13c that extends through the insulating film 50. The multiple interconnects 403 are connected with an electrode 20B that extends in the Y-direction. The interconnect 406 is electrically isolated from the electrode 30. The interconnect 40A and the interconnect 406 are apart from each other in the Y-direction and are electrically isolated. The interconnect 40A and the interconnect 406 are alternately arranged in the Y-direction. The interconnect 40A and the interconnect 40B are, for example, metal films.

Figure 10:
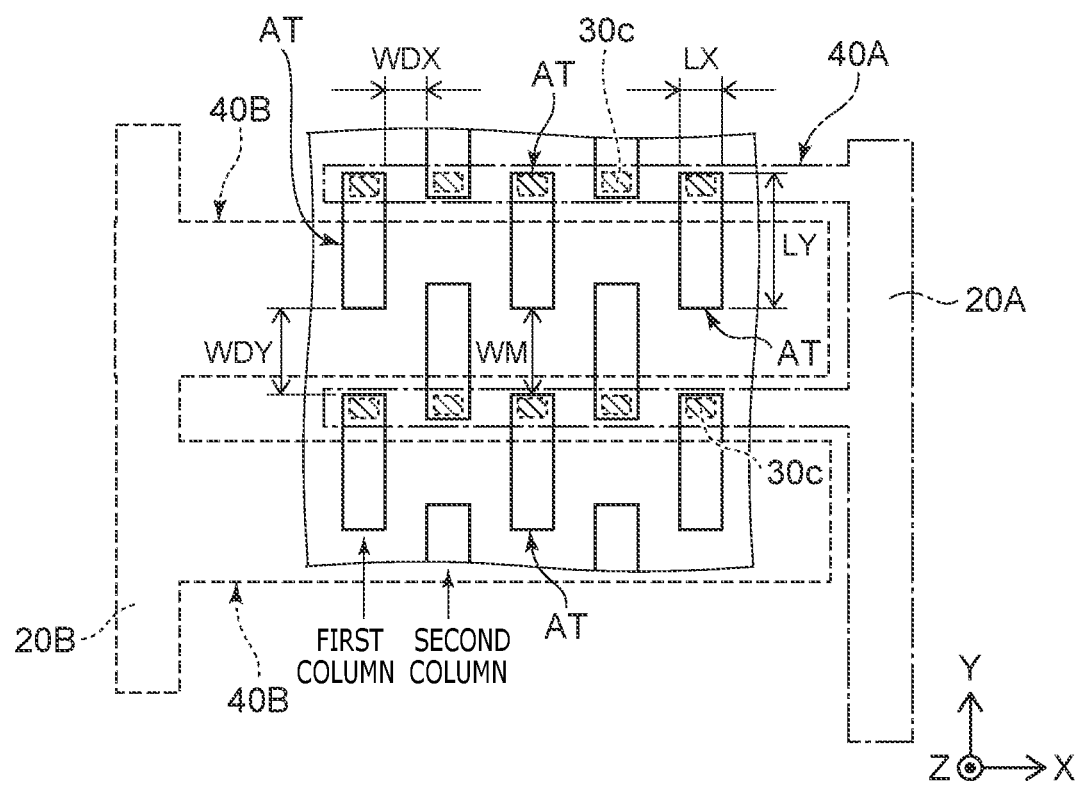
FIG. 10 is a schematic view showing another example of the configuration of the interconnect in the semiconductor device according to the embodiment.

FIG. 10 is a schematic view showing another example of the configuration of the interconnect 40 of the semiconductor device 5 according to the embodiment. FIG. 10 is a schematic plan view showing an example of the interconnects 40A and 40B provided in the semiconductor device that has the configuration shown in FIG. 43, The contacts of the interconnect 40B are not illustrated in FIG. 10.

As shown in FIG. 10, by providing the contacts 30c of the interconnect 40A at the end portions in the Y-direction of the trenches AT, the ratio of the contact area to the area occupied by the interconnect 40A becomes large compared to a case in which the contacts 30c are provided at the centers of the trenches AT.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying Maims and their equivalents are intended to cover such forms or modifications as would fall within the scope and spirit of the invention.

What is claimed is:

1. A semiconductor device, comprising:
a first semiconductor layer of a first conductivity type;
a second semiconductor layer of the first conductivity type provided on the first semiconductor layer, the second semiconductor layer including a first-conductivity-type impurity with a lower concentration than a concentration of a first-conductivity-type impurity in the first semiconductor layer;
a third semiconductor layer of a second conductivity type provided on the second semiconductor layer, the third semiconductor layer including a first surface at a side opposite to the second semiconductor layer, the first surface extending in a first direction and a second direction crossing the first direction;
a plurality of electrodes provided on the second semiconductor layer, the plurality of electrodes respectively extending inside trenches, the trenches each having depths enough to extend from the first surface into the second semiconductor layer; and
a first insulating film provided between the third semiconductor layer and one of the plurality of electrodes and between the second semiconductor layer and the one of the plurality of electrodes,
the plurality of electrodes including a first electrode group and a second electrode group,
the first electrode group being arranged in one column in the first direction and apart from each other by a first distance,
the second electrode group being arranged in another column in the first direction and apart from each other by the first distance,
the first electrode group and the second electrode group being apart from each other by a second distance in the second direction, the first distance being greater than the second distance,
each of the trenches having a first length in the first direction, and a second length in the second direction,
the second length being less than the first length, and
the first distance being less than the first length in the first and second electrode groups.

2. The device according to claim 1, wherein
the first distance is provided such that a portion of the second semiconductor layer between two adjacent electrodes of the plurality of electrodes is depleted when a prescribed voltage is applied between the first semiconductor layer and the third semiconductor layer.

3. The device according to claim 1, wherein
a current path of the second semiconductor layer positioned between the plurality of electrodes is pinched off when a prescribed voltage is applied between the first semiconductor layer and the third semiconductor layer and between the first semiconductor layer and the plurality of electrodes.

4. The device according to claim 1, wherein
the first distance is not more than 2 micrometers.

5. The device according to claim 1, wherein
a surface area of the third semiconductor layer at the first surface is greater than a sum of a surface area of the plurality of first insulating films and a surface area of the plurality of electrodes at a level same as a level of the first surface.

6. The device according to claim 1, wherein
the trench has a first length in the first direction, and a second length in the second direction, and
the second length is less than the first length.
7. The device according to claim 1, wherein
the first electrode group and the second electrode group are adjacent in the second direction, and
each electrode of the second electrode group and a space between adjacent electrodes of the first electrode group are arranged in the second direction.
8. The device according to claim 7, wherein
the trench has a polygonal shape in a cross-section parallel to the first surface.
9. The device according to claim 1, wherein
no semiconductor layer of the first conductivity type is provided on the third semiconductor layer.
10. The device according to claim 1, wherein
the semiconductor device is a diode.

* * * * *